United States Patent
Oh

(10) Patent No.: US 11,131,707 B1
(45) Date of Patent: Sep. 28, 2021

(54) TEST SOCKET AND TEST APPARATUS HAVING THE SAME, MANUFACTURING METHOD FOR THE TEST SOCKET

(71) Applicant: TSE CO., LTD., Chungcheongnam-do (KR)

(72) Inventor: Chang Su Oh, Chungcheongnam-do (KR)

(73) Assignee: TSE CO., LTD., Chungcheongnam-do (KR)

( * ) Notice: Subject to any disclaimer, the term of this patent is extended or adjusted under 35 U.S.C. 154(b) by 0 days.

(21) Appl. No.: 17/209,444

(22) Filed: Mar. 23, 2021

(30) Foreign Application Priority Data

Mar. 25, 2020 (KR) .......................... 10-2020-0036360

(51) Int. Cl.
*G01R 31/28* (2006.01)
*G01R 1/04* (2006.01)

(52) U.S. Cl.
CPC ....... *G01R 31/2886* (2013.01); *G01R 1/0466* (2013.01)

(58) Field of Classification Search
CPC ............ G01R 31/2896; G01R 31/2889; G01R 31/2886; G01R 31/2879; G01R 1/07314; G01R 1/0466
See application file for complete search history.

(56) References Cited

U.S. PATENT DOCUMENTS

| | | | | |
|---|---|---|---|---|
| 6,489,790 B1 * | 12/2002 | An | ........................ | G01R 1/0483 324/754.14 |
| 9,759,742 B2 * | 9/2017 | Lee | ...................... | G01R 1/0433 |

FOREIGN PATENT DOCUMENTS

| | | |
|---|---|---|
| JP | 09-512139 | 12/1997 |
| KR | 10-1997-0705029 | 9/1997 |
| KR | 10-2006-0062824 | 6/2006 |
| KR | 10-1204941 | 11/2012 |
| KR | 10-1339167 | 12/2013 |
| KR | 10-1366171 | 4/2014 |
| KR | 10-1672935 | 11/2016 |
| KR | 10-2036105 | 10/2017 |
| KR | 10-2018-0092167 | 8/2018 |
| KR | 10-2093854 | 3/2020 |
| KR | 10-2133340 | 7/2020 |
| KR | 10-2020-0110011 | 9/2020 |

OTHER PUBLICATIONS

Notice of Allowance dated Nov. 6, 2020 corresponding to Korean Patent Application No. 10-2020-0036360.

* cited by examiner

*Primary Examiner* — Tung X Nguyen

(57) ABSTRACT

A test socket according to the present disclosure is provided in a test apparatus in which a device under inspection having a terminal is connected to a tester, which generates a test signal, for testing the device under inspection, the test socket includes a nonelastic insulating housing formed of a nonelastic insulating material and provided with a plurality of housing holes formed therein to pass therethrough in a thickness direction; and an electrically-conductive part formed to have a configuration in which a plurality of electrically-conductive particles are contained in an elastic insulating material, the electrically-conductive part having a lower end portion connected to a signal electrode of the tester placed below the nonelastic insulating housing and an upper end portion disposed in the housing hole to be connected to the terminal of the device under inspection placed on the nonelastic insulating housing.

13 Claims, 6 Drawing Sheets

< Prior Art >

FIG. 5
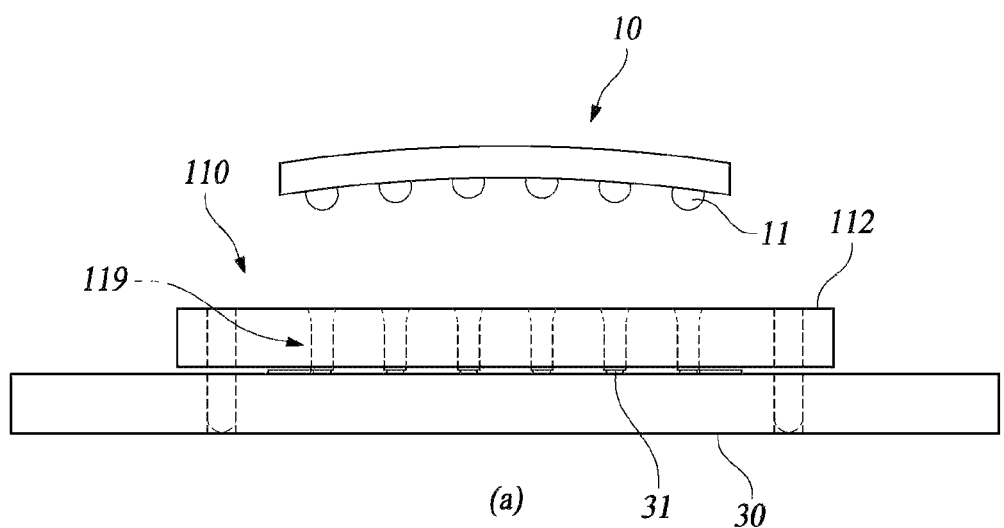
(a)
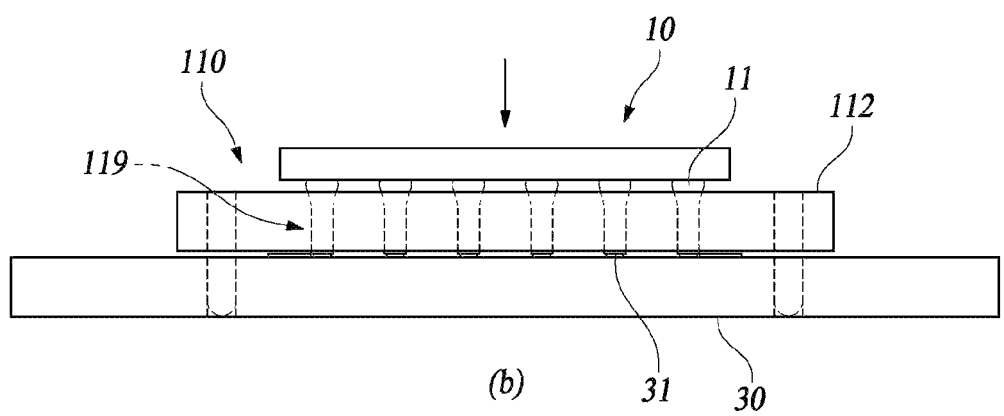
(b)

TEST SOCKET AND TEST APPARATUS HAVING THE SAME, MANUFACTURING METHOD FOR THE TEST SOCKET

CROSS-REFERENCE TO RELATED APPLICATION

This application claims priority of Korean Patent Application No. 10-2020-0036360, filed on Mar. 25, 2020, in the KIPO (Korean Intellectual Property Office), the disclosure of which is incorporated herein entirely by reference.

BACKGROUND OF THE INVENTION

Field of the Invention

The present disclosure relates to a test socket, and more particularly, to a test socket configured to electrically connect a device under inspection and a tester to each other, a test apparatus including the same, and a method for manufacturing the test socket.

Description of the Related Art

A semiconductor package is formed by integrating fine electronic circuits at a high density, and during the manufacturing process, a test process is performed to determine whether each electronic circuit is normal. The test process is a process of selecting good and defective products by testing whether the semiconductor package is operating normally.

A test apparatus, which electrically connects a terminal of the semiconductor package and a tester applying a test signal to each other, is employed for testing of the semiconductor package. The test apparatus has various configurations depending on the type of semiconductor package to be tested. The test apparatus and the semiconductor package are not directly connected to each other, but indirectly connected through a test socket.

Typical test sockets are a pogo socket and a rubber socket. Among them, the rubber socket has a configuration in which an electrically-conductive part (which is formed to have a configuration in which a plurality of electrically-conductive particles are contained in a material having elasticity such as silicon) is arranged inside an insulating part (which formed of a material having elasticity such as silicon) to be insulated from each other. Since such the rubber socket does not use a mechanical means such as soldering or a spring, it has excellent durability and has the advantage of achieving simple electrical connection, so it has been widely used in recent years.

In a test apparatus including the rubber socket type test socket, the amount of contact stroke of the test socket is determined depending on a vertical thickness of a stroke limiting part placed at a periphery of a pressurizing part of a pusher pressurizing the semiconductor package and a stopper part placed at a periphery of an electrically-conductive part of the test socket, a thickness of the semiconductor package, a height of the test socket, and the like.

However, the conventional test apparatus had difficulty in precise stroke control due to an addition of a thickness tolerance of the stroke limiting part, a thickness tolerance of the stopper part, a height tolerance of the test socket, and a thickness tolerance of the semiconductor package.

In addition, the test socket provided in the conventional test apparatus has a problem that its life is rapidly shortened during inspection of the device under inspection on which fine warpage has been occurred. The device under inspection may be finely bent into a shape in which a central portion rises upward as compared with an edge during manufacture, or into another shape. It may be difficult to check this warpage of the device under inspection with the naked eye, however, during inspection, a terminal of the device under inspection is not stably brought into contact with the test socket, or may shock the test socket.

For example, as shown in FIG. 1, when a device 10 under inspection, which is bent into a shape in which a central portion rises upward as compared with an edge, is compressed to a conventional test socket 20, pressures applied to electrically-conductive parts 21 of the test socket 20 may differ from each other due to a difference in height among the terminals 11 provided in the device 10 under inspection. That is, among the plurality of electrically-conductive parts 21 provided in the test socket 20, the electrically-conductive parts 21 disposed at the edge are subjected to a relatively large pressurizing force. At this time, concentrated stress is generated in the electrically-conductive part 21 subjected to a relatively large pressurizing force, and if this phenomenon is repeated, the electrically-conductive part 21 where concentrated stress is generated is damaged, so there arises a problem in that life of the test socket 20 is shortened.

The above-described information disclosed in the background description is provided only for improving the understanding of the background of the present disclosure, and thus may include the information which does not constitute the prior art.

SUMMARY OF THE INVENTION

The present disclosure is conceived in the light of the above problems, an object of the present disclosure is to provide a test socket reducing difficulty in stroke control caused by a thickness tolerance of a device under inspection, capable of precisely controlling the stroke, and having excellent durability, a test apparatus including the same, and a method for manufacturing the test socket.

In order to achieve the above object, the present disclosure provides a test socket provided in a test apparatus in which a device under inspection having a terminal is connected to a tester, which generates a test signal, for testing the device under inspection, this test socket may include a nonelastic insulating housing formed of a nonelastic insulating material and provided with a plurality of housing holes formed therein to pass therethrough in a thickness direction; and an electrically-conductive part formed to have a configuration in which a plurality of electrically-conductive particles are contained in an elastic insulating material, the electrically-conductive part having a lower end portion connected to a signal electrode of the tester placed below the nonelastic insulating housing and an upper end portion disposed in the housing hole to be connected to the terminal of the device under inspection placed on the nonelastic insulating housing, whereby the electrically-conductive part passes through the nonelastic insulating housing in the thickness direction. Here, an alignment hole may be formed in the nonelastic insulating housing to pass through the nonelastic insulating housing in the thickness direction, whereby an alignment pin of an element used for fixing the nonelastic insulating housing to the tester can pass through the alignment hole.

It is preferable that the nonelastic insulating housing has hardness in the range of 3B to 6H.

The nonelastic insulating housing may be formed of polyimide.

The electrically-conductive part may include an electrically-conductive part body placed in the housing hole and an electrically-conductive part lower bump connected to the electrically-conductive part body to protrude from a lower surface of the nonelastic insulating housing, the electrically-conductive part may satisfy the following condition.

$$0.05 \leq \frac{Lb}{Lt} \leq 0.5$$

Here, Lt is the sum of a length of the electrically-conductive part body and a length of the electrically-conductive part lower bump, and Lb represents a length of the electrically-conductive part lower bump.

The housing hole may include a housing lower hole extending upward from a lower surface of the nonelastic insulating housing and having a constant width; and a housing upper hole formed to have a tapered shape in which a width thereof is gradually decreased from an upper surface the nonelastic insulating housing towards a lower side, and being in in communication with the housing lower hole.

The test socket according to the present disclosure may further include an insulating part formed of an elastic insulating material and disposed between the nonelastic insulating housing and the electrically-conductive part.

The test socket according to the present disclosure may further include an upper insulating sheet formed of an insulating material, providing with upper insulating sheet holes formed at positions corresponding to the electrically-conductive parts, and coupled to the upper surface of the nonelastic insulating housing. Here, the upper insulating sheet hole may be formed to have a tapered shape such that a width of at least a portion thereof is gradually decreased from an upper surface of the upper insulating sheet towards the nonelastic insulating housing.

The electrically-conductive part may include an electrically-conductive part body placed in the housing hole, and an electrically-conductive part upper bump connected to the electrically-conductive part body and protruding from the upper surface of the nonelastic insulating housing, and a width of the uppermost portion of the upper insulating sheet hole may be larger than that of the electrically-conductive part upper bump.

Meanwhile, in order to achieve the above object, the present disclosure provides a test apparatus configured to connect a device under inspection having a terminal to a tester generating a test signal, for testing the device under inspection, this test apparatus may include a test socket configured to electrically connect the tester and the device under inspection for enabling a test signal of the tester to be transmitted to the device under test; a guide housing coupled to the tester to fix the test socket to the tester, and having an alignment pin inserted into a fixing hole of the tester; and a pusher being movable to approach the tester or moved away from the tester, thereby providing a pressurizing force capable of pressurizing the device under inspection placed on the test socket towards the tester. Here, the test socket may include a nonelastic insulating housing formed of a nonelastic insulating material, and provided with a plurality of housing holes formed therein to pass therethrough in a thickness direction and an alignment hole formed to pass therethrough in a thickness direction for enabling the alignment pin to pass the alignment hole; and an electrically-conductive part formed to have a configuration in which a plurality of electrically-conductive particles are contained in an elastic insulating material, the electrically-conductive part having a lower end portion connected to a signal electrode of the tester placed below the nonelastic insulating housing and an upper end portion disposed in the housing hole to be connected to the terminal of the device under inspection placed on the nonelastic insulating housing, whereby the electrically-conductive part passes through the nonelastic insulating housing in the thickness direction.

The test apparatus according to the present disclosure may further include a buffering part disposed between the pusher and the device under inspection so as to buffer a pressure applied to the device under inspection by the pusher.

Meanwhile, in order to achieve the above object, the present disclosure provides a method for manufacturing a test socket provided in a test apparatus in which a device under inspection having a terminal is connected to a tester, which generates a test signal, to test the device under inspection, this method may include the steps of: (a) preparing a nonelastic member formed of a nonelastic insulating material; (b) forming a plurality of housing holes and an alignment hole in the nonelastic insulating material to form a nonelastic insulating housing, the plurality of housing holes passing through the nonelastic insulating material in a thickness direction and the alignment hole passing through the nonelastic insulating material in the thickness direction to enable an alignment pin of an element, which is used for fixing the test socket to the tester, to pass through nonelastic insulating material; and (c) forming an electrically-conductive part in the housing hole, the electrically-conductive part comprising an elastic insulating material in which a plurality of electrically-conductive particles is included.

In the step (c), the electrically-conductive part may be formed to satisfy the following condition.

$$0.05 \leq \frac{Lb}{Lt} \leq 0.5$$

Here, Lt is the sum of a length of the electrically-conductive part body placed in the housing hole and a length of the electrically-conductive part lower bump connected to the electrically-conductive part body to protrude from a lower surface of the nonelastic insulating housing, and Lb represents a length of the electrically-conductive part lower bump.

The step (c) may include the steps of; filling the plurality of housing holes with an electrically-conductive particle mixture in which electrically-conductive particles are contained in an elastic insulating material; preparing a mold having a plurality of mold holes corresponding to the plurality of housing holes and filling the plurality of mold holes with the electrically-conductive particle mixture; coupling the mold to a lower surface of the nonelastic insulating housing so as to correspond the plurality of mold holes to the plurality of housing holes in a one-to-one relation; and integrally curing electrically-conductive particle mixtures contained in the housing hole and the mold hole.

In the test apparatus according to the present disclosure, the test socket including the nonelastic insulating housing formed of a nonelastic material and supporting the plurality of electrically-conductive parts is used to electrically connect the tester and the device under inspection, so that the pressurizing force of the pusher may be evenly applied between the device under inspection and the test socket and between the test socket and the tester. Further, when the pusher pressurizes the device under inspection, the electrically-conductive part bump of the electrically-conductive part protruding from a lower surface of the nonelastic insulating housing may be elastically deformed to provide a stroke required to connect the terminal of the device under inspection to the tester. Therefore, difficulty in stroke control occurred in a conventional technique using a rubber socket type test socket due to a thickness tolerance of a stroke restricting part, a thickness tolerance of a stopper part of the test socket, a height tolerance of the test socket, a thickness tolerance of the device under inspection, or the like is reduced, and it is possible to precisely control the stroke.

In addition, in the test socket according to the present disclosure, the nonelastic insulating housing is formed of a material having a relatively low dielectric constant so that electromagnetic wavelengths can be propagated well, so high-frequency signal transmission characteristics can be improved. In addition, even if the electrically-conductive parts having the same diameter are applied, using a nonelastic insulator rather than an elastic insulator is advantageous for improving signal transmission characteristics, so the signal transmission characteristic of the present disclosure is superior to that of the prior art.

In addition, since the test socket according to the present disclosure utilizes the nonelastic insulating housing having nonelastic properties as an insulating housing supporting the plurality of electrically-conductive parts, deformation is minimized and durability is excellent as compared with the conventional test socket.

In addition, in the test socket according to the present disclosure, the alignment hole is formed in the nonelastic insulating housing for assembling the test socket with a component such as a guide housing coupled to the tester. Therefore, the test socket according to the present disclosure can be assembled with components such as the guide housing without the need for a separate frame as in the prior art, and since the test socket is directly assembled with components such as the guide housing and the like, it can be precisely aligned and arranged on the tester.

BRIEF DESCRIPTION OF THE DRAWINGS

The above and other features and advantages will become more apparent to those of ordinary skill in the art by describing in detail exemplary embodiments with reference to the attached drawings, in which:

FIG. 5 is a view illustrating a process in which a device under inspection comes into contact with the test socket provided in the test apparatus according to one embodiment of the present disclosure;

In the following description, the same or similar elements are labeled with the same or similar reference numbers.

DETAILED DESCRIPTION

Figure 1:
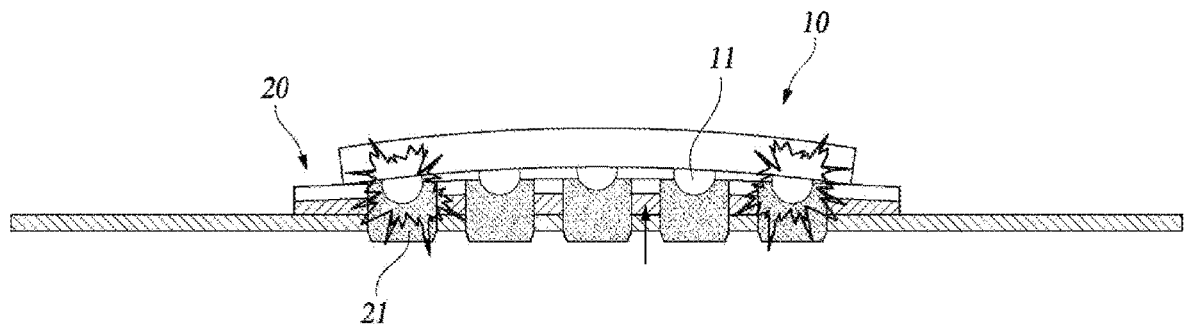
FIG. 1 is a view illustrating a state in which a device under inspection is in contact with a conventional test socket.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

Hereinafter, a test socket, a test apparatus including the same, and a method of manufacturing the test socket according to the present disclosure will be described in detail with reference to the accompanying drawings.

Figure 2:
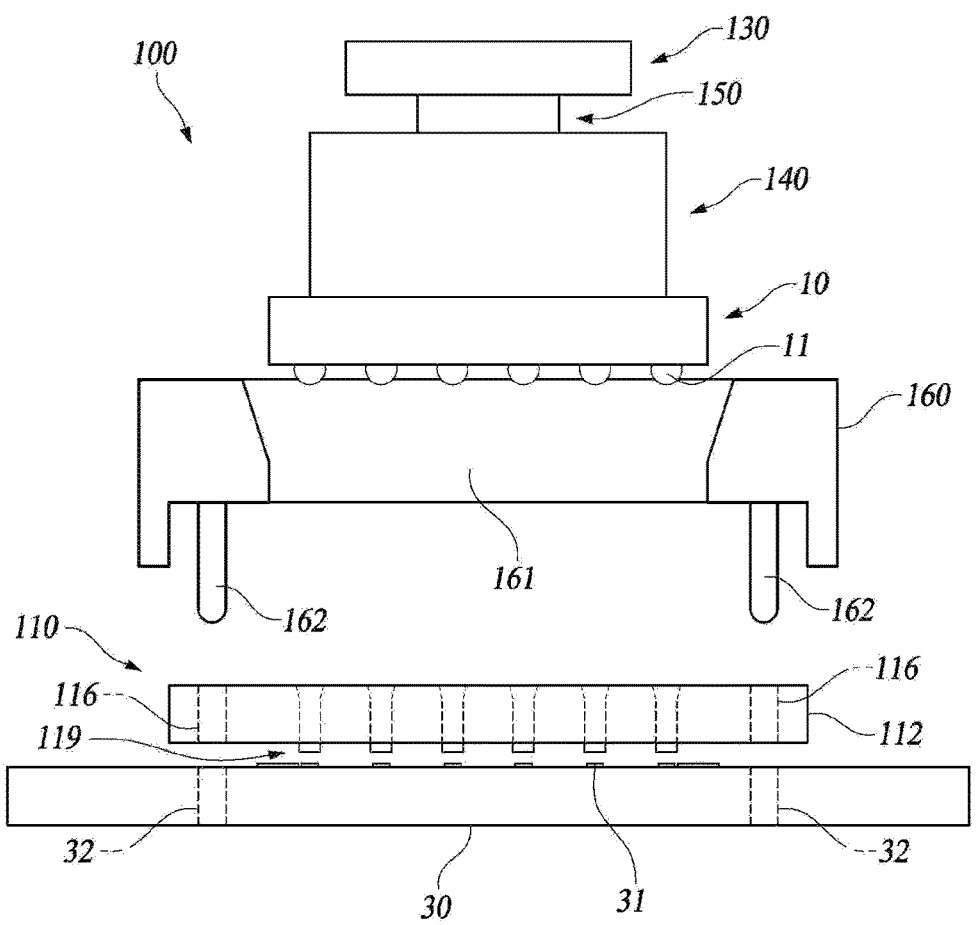
FIG. 2 is a front view illustrating a test apparatus according to one embodiment of the present disclosure.

FIG. 2 is a front view illustrating a test apparatus according to one embodiment of the present disclosure, and FIG.

3 is a cross-sectional view illustrating a test socket provided in the test apparatus according to one embodiment of the present disclosure.

As illustrated in the drawings, a test apparatus 100 according to one embodiment of the present disclosure is provided for connecting a device 10 under inspection having a terminal 11 to a tester 30 generating a test signal, to test the device 10 under inspection, and the above test apparatus includes a test socket 110 configured to electrically connect the tester 30 and the device 10 under inspection to each other, a pusher 130 for pressurizing the device 10 under inspection placed on the test socket 110 towards the tester 20, and a guide housing 160 for securing the test socket 110 to the tester 30.

The test socket 110 includes a nonelastic insulating housing 112 having a plurality of housing holes 113 formed therein, and a plurality of electrically-conductive parts 119 disposed in the plurality of housing holes 113, respectively and passing through the nonelastic insulating housing 112 in the thickness direction.

The nonelastic insulating housing 112 is formed of a nonelastic insulating material, and supports the plurality of electrically-conductive parts 119 so as to be spaced apart from each other. The housing hole 113 is formed to pass through the nonelastic insulating housing 112 in the thickness direction. The housing hole 113 includes a lower housing hole 114 having a uniform width and formed at a relatively lower side of the nonelastic insulating housing 112, and an upper housing hole 115 formed at a relatively upper side of the nonelastic insulating housing 112 to be in communication with the lower housing hole 114. The upper housing hole 115 has a shape in which a width thereof is gradually increased as a distance from the lower housing hole 114 is increased.

The nonelastic insulating housing 112 is provided with an alignment hole 116 passing through the nonelastic insulating housing 112 in the thickness direction together with the housing hole 113. The alignment hole 116 is arranged to be biased from the housing hole 113 towards an edge of the nonelastic insulating housing 112. An alignment pin 162 of the guide housing 160 is inserted into the alignment hole 116.

The nonelastic insulating housing 112 may be formed of an engineering plastic such as polyimide, or various other nonelastic insulating materials.

The nonelastic insulating housing 112 is not elastically deformed as easily as an elastic insulating part of a conventional rubber socket, but preferably has a characteristic which causes bending deformation. This characteristic increases resistance to the device under inspection having various types of warpage deformation, and is advantageous in increasing durability and life. In particular, when the nonelastic insulating housing 112 has warpage deformation, the bending deformation characteristic has a great influence on durability of the nonelastic insulating housing 112. Warpage deformation may be generated in the nonelastic insulating housing 112 during manufacture or handling. The nonelastic insulating housing 112 having warpage deformability must be warpage-deformed in the unfolding direction when it comes into contact with the device 10 under inspection after being mounted to the tester 30, and accordingly, the electrically-conductive part 119 disposed thereon can be stably brought into contact with the terminal of the device 10 under inspection.

The nonelastic insulating housing 112 is not easily elastically deformed by a pressurizing force of the pusher 130, but a hardness of the nonelastic insulating housing 112 needs to be within an appropriate range so that it can be warpage-deformed. That is, it is preferable that the nonelastic insulating housing 112 has the hardness sufficient to allow bending deformation to be occurred even at the minimum pressurizing force of the pusher 130 while allowing compressive deformation not to be occurred by the maximum pressurizing force of the pusher 130.

A hardness of a soft film material is not expressed as a hardness value based on the amount of stamping such as a Vickers hardness, but is expressed as a degree of surface scratching obtained by using a pencil. Typically, the hardness representing the degree of surface scratching is expressed within the range of 8B, which is the lowest hardness, to 9H, which is the highest hardness.

The preferable hardness of the nonelastic insulating housing 112 is in the range of 3B to 6H. When the hardness of the nonelastic insulating housing 112 is less than 3B, the nonelastic insulating housing 112 may be compressively deformed by the maximum pressurizing force of the pusher 130, and a surface of the nonelastic insulating housing 112 may be damaged by repeated contact with the device 10 under inspection. On the other hand, when the hardness of the nonelastic insulating housing 112 exceeds 6H, if the nonelastic insulating housing 112 has warpage deformation, it is difficult to obtain bending deformation of the nonelastic insulating housing 112 in the unfolding direction caused by the minimum pressurizing force of the pusher 130. In this case, the electrically-conductive part 119 provided in the nonelastic insulating housing 112 is not stably connected to a signal electrode of the tester or the terminal of the device 10 under inspection, so this may lead to a damage of the nonelastic insulating housing 112 or a damage of the device under inspection.

The electrically-conductive part 119 may be formed to have a configuration in which a plurality of electrically-conductive particles are contained in an elastic insulating material such that it can be connected to a signal electrode 41 of the tester 20 and the terminal 11 of the device 10 under inspection. The electrically-conductive part 119 may be disposed in the housing hole 113 to pass through the nonelastic insulating housing 112 in the thickness direction.

As the electrically-conductive part 119 is disposed in the housing hole 113, a lower end portion thereof may be connected to the signal electrode 41 of the tester 30 placed below the nonelastic insulating housing 112, and an upper end portion may be connected to the terminal 11 of the device 10 under inspection placed above the nonelastic insulating housing 112. The electrically-conductive part 119 includes an electrically-conductive part body 120 placed in the housing hole 113 and an electrically-conductive part lower bump 123 which is connected to the electrically-conductive part body 120 to protrude from a lower surface of the nonelastic insulating housing 112. The electrically-conductive part body 120 includes a lower body 121 disposed in the lower housing hole 114 of the housing hole 113 and an upper body 122 disposed in the upper housing hole 115 of the housing hole 113. The upper body 122 is formed to have a shape in which a width thereof is gradually increased as a distance from the lower body 121 is increased.

Some of the plurality of electrically-conductive parts 119 may be in contact with the signal electrode 41 of the tester 30 for transmitting the signal, and other parts may be used for a ground.

As an elastic insulating material constituting the electrically-conductive part 119, a heat-resistant polymer material having a crosslinked structure, for example, silicone rubber, polybutadiene rubber, natural rubber, polyisoprene rubber, styrene-butadiene copolymer rubber, acrylonitrile-butadiene copolymer rubber, styrene-butadiene-diene block copolymer rubber, styrene-isoprene block copolymer rubber, urethane rubber, polyester rubber, epichlorohydrin rubber, ethylene-propylene copolymer rubber, ethylene-propylene-Diene copolymer rubber, soft liquid epoxy rubber, and the like may be employed.

In addition, as the electrically-conductive particles constituting the electrically-conductive part 119, particles having magnetism may be employed such that is may be reacted by a magnetic field. For example, as the electrically-conductive particles, particles obtained by plating a surface of core particle, for example, particles of metals exhibiting magnetism, such as iron, nickel, cobalt, etc., or alloy particles thereof, or particles containing these metals, or particles of these metals, with a metal having excellent electrical-conductivity, such as gold, silver, palladium, radium, or the like; particles obtained by plating a surface of core particle, for example, non-magnetic metal particles, inorganic substance particles such as glass beads or the like, and polymer particles, with electrically-conductive magnetic substance such as nickel, cobalt, or the like; or particles obtained by plating core particle with electrically-conductive magnetic substance and a metal having excellent electrical-conductivity may be employed.

The electrically-conductive part 119 has a structural feature as below.

$$0.05 \leq \frac{Lb}{Lt} \leq 0.5$$

Here, Lt is the sum of a length of the electrically-conductive part body 120 and a length of the electrically-conductive part lower bump 123, and Lb represents a length of the electrically-conductive part lower bump 123.

The electrically-conductive part 119 having the above configuration may smoothly provide a stroke necessary to connect the terminal 11 of the device 10 under inspection to the tester 30. In addition, the electrically-conductive part 119 including the electrically-conductive part lower bump 123 distributes the load when the terminal 11 of the device 10 under inspection comes into contact therewith, so that this is advantageous for preventing damage to the device 10 under inspection.

That is, the electrically-conductive part lower pump 123 protruding from the lower surface of the nonelastic insulating housing 112 has a relatively high degree of freedom because it does not have a portion held by the nonelastic insulating housing 112. Accordingly, if the electrically-conductive part lower pump 123 is designed to have an appropriate length, it is possible to induce a fine movement of the test socket 230 when the device 10 under inspection comes into contact therewith. In addition, if the test socket 110 is finely moved upward, downward, forward, backward or from side to side when the device 10 under inspection comes into contact therewith, it is possible to obtain an effect of distributing a load according to the contact of the device 10 under inspection and of buffering an impact.

A length of the electrically-conductive part lower bump 123 may be appropriately determined according to a width or the number of the electrically-conductive part 119. If a length of the electrically-conductive part lower bump 123 is too short, fine movement of the test socket 110 cannot be induced, and if a length of the electrically-conductive part lower bump 123 is too long, there is a problem in that durability is deteriorated. Therefore, it is preferable that a length of the electrically-conductive part lower bump 123 is determined to satisfy the following condition, as described above.

$$0.05 \leq \frac{Lb}{Lt} \leq 0.5$$

When a ratio of the length Lb of the electrically-conductive part lower bump 123 to the length Lt which is a sum of a length of the electrically-conductive part body 120 and a length of the electrically-conductive part lower bump 123 is less than 0.05, it is difficult to smoothly provide a stroke required to connect the terminal 11 of the device 10 under inspection to the tester 30, and it is not possible to induce fine movement of the test socket 110, so there is no load distribution effect.

On the other hand, when a ratio of the length Lb of the electrically-conductive part lower bump 123 to the length Lt which is a sum of a length of the electrically-conductive part body 120 and a length of the electrically-conductive part lower bump 123 exceeds 0.05, there are problems in that durability of the test socket 110 is deteriorated and product life is shortened. That is, if the length Lb of the electrically-conductive part lower bump 123 is too long, when contacting with the device 10 under inspection, the electrically-conductive part lower bump 123 is bent, whereby the electrically-conductive part lower bumps 124 come into contact with each other to cause a short failure or the electrically-conductive part lower bump 124 may be damaged.

The pusher 130 is configured to be moved towards the tester 30 or moved away from the tester 30 to provide a pressurizing force by which the device 10 under inspection disposed on the test socket 110 may be pressurized towards the tester 30. The pusher 130 may receive a moving force from a driving part (not shown) to be moved.

A pressurizing part 140 and a buffering part 150 are provided below the pusher 130, and the pusher 130 may pressurize the device 10 under inspection through the pressurizing part 140 and the buffering part 150. The pressurizing part 140 comes into contact with an upper surface of the device 10 under inspection to transmit the pressurizing force of the pusher 130 to the device 10 under inspection. The buffering part 150 serves to buffer a pressure applied to the device 10 under inspection by the pusher 130. The buffering part 150 may be made of a material having elasticity such as rubber, silicone or the like, or may take various configurations capable of absorbing shock, such as a structure including a spring or the like.

When the pressurizing part 140 pressurizes the device 10 under inspection, load applied to the device 10 under inspection, the test socket 110, and the tester 30 by the pusher 130 may be restricted so as not to be excessive due to a buffering action of the buffering part 150. Accordingly, damage or breakage of the device 10 under inspection, the test socket 110, or the tester 30 caused by the excessive pressurizing force may be prevented.

The guide housing 160 is coupled to the tester 30 to secure the test socket 110 to the tester 30. In addition, the guide housing 160 may guide the device 10 under inspection towards the test socket 110. An opening 161 through which the device 10 under inspection may pass is provided in the guide housing 160. In addition, the guide housing 160 is provided with the alignment pin 162 inserted into a fixing hole 32 of the tester 30. The guide housing 160 is coupled to the tester 30 in such a way that the alignment pin 162 passes through the alignment hole 116 of the nonelastic insulation housing 112 and is inserted into the fixing hole 32, and may align the test socket 110 at a predetermined location of the tester 30 and then fix the test socket to the tester.

A conventional rubber socket having an elastic insulating part is coupled to a frame, which is formed of a hard material and has an alignment hole into which an alignment pin of a guide housing is inserted, and is then installed to a tester. Since such a conventional rubber socket is assembled through a separate frame, there is a problem in that alignment accuracy on the tester is deteriorated due to an assembly error between the rubber socket and the frame.

On the contrary, in the test socket 110 according to the present disclosure, since the alignment hole 116 for assembling the nonelastic insulating housing with the guide housing 160 is formed in the nonelastic insulating housing 112, a distance from the alignment hole 116 to the housing hole 113 in which the electrically-conductive part 119 is disposed is constant. In addition, since the test socket 110 is directly assembled with the guide housing 160, it may be precisely aligned and disposed on the tester 30.

When the device 10 under inspection is inspected, the test apparatus 100 according to one embodiment of the present disclosure is operates in the following manner.

Figure 3:
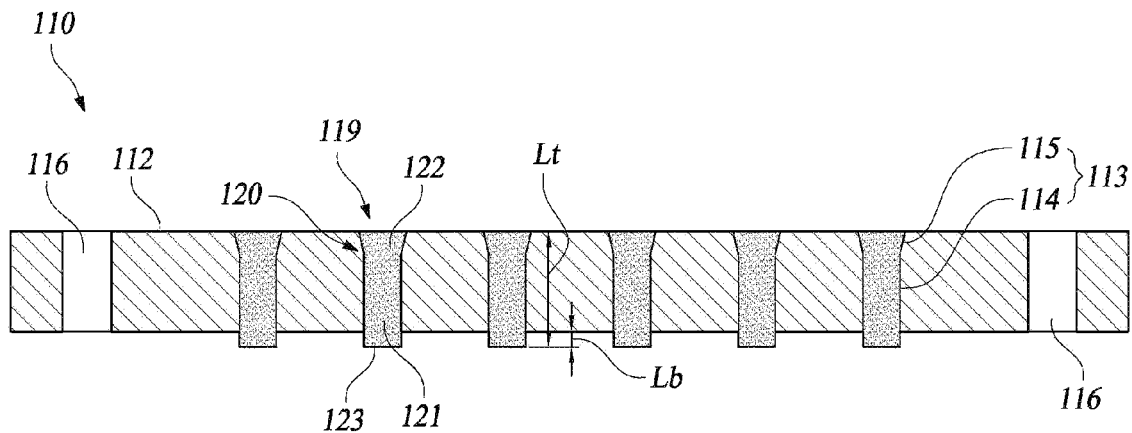
FIG. 3 is a cross-sectional view illustrating a test socket provided in the test apparatus according to one embodiment of the present disclosure.
Figure 4:
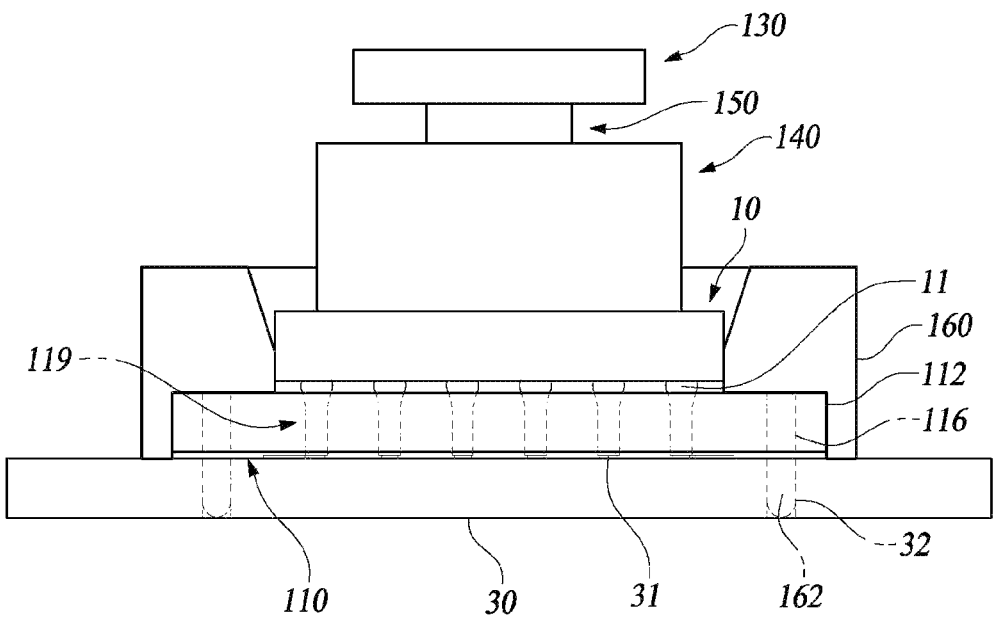
FIG. 4 is a view for explaining operation of the test apparatus according to one embodiment of the present disclosure.

As shown in FIG. 3, when the pusher 130 pressurizes the device 10 under inspection towards the test socket 110 through the pressurizing part 140 and the buffering part 150, the terminal 11 of the device 10 under inspection is compressed to an upper end portion of the electrically-conductive part 119 of the test socket 110, and a lower end portion of the terminal 11 is compressed to the signal electrode 41 of the tester 30. At this time, a test signal generated from the tester 30 may be transmitted to the device 10 under inspection through the test socket 110 to perform an electrical test on the device 10 under inspection.

When the terminal 11 of the device 10 under inspection is compressed to the electrically-conductive part 119 of the test socket 110, since the electrically-conductive part 119 has elasticity, the terminal 11 enters inside the housing hole 113 while elastically deforming the electrically-conductive part 119. At this time, a lower surface of the device 10 under inspection test 10 may come into contact with an upper surface of the nonelastic insulating housing 112. In addition, the electrically-conductive part lower bump 123 of the electrically-conductive part 119 may be compressed by the pressurizing force with which the device 10 under inspection pressurizes the test socket 110, until the lower surface of the nonelastic insulating housing 112 comes into contact with the upper surface of the tester 30. As the lower surface of the nonelastic insulating housing 112 is in contact with the upper surface of the tester 30, the stroke is not increased further.

In this way, the lower surface of the device 10 under inspection comes into contact with the upper surface of the nonelastic insulating housing 112 to pressurize the test socket 110 towards the tester 30, so the pressurizing force applied to the device 10 under inspection can be evenly transmitted to the entire test socket 110, and the plurality of electrically-conductive parts 119 together with the plurality of signal electrodes 41 and the plurality of terminals 11 may be maintained in a contact state with an entirely uniform contact force. Accordingly, the plurality of signal electrodes 41 and the plurality of terminals 11 can be maintained in a stable connection state through the test socket 110, so a stable test is possible without signal transmission loss.

On the other hand, while the pusher 130 pressurize the device 10 under inspection towards the tester 30, after the lower surface of the test socket 110 gest in touch with the tester 30, the buffering part 150 is elastically deformed, so further stroke is not applied. In addition, since the buffering part 150 buffers the pressurizing force of the pusher 130, damage or breakage of the device 10 under inspection, the test socket 110, or the tester 30 due to excessive pressurizing force can be prevented.

As described above, in the test apparatus 100 according to one embodiment of the present disclosure, by electrically connecting the tester 30 and the device 10 under inspection using the test socket 110 including the nonelastic insulating housing 112 formed of a nonelastic insulating material and supporting the plurality of electrically-conductive parts 119, the pressurizing force of the pusher 130 may be evenly applied between the device 10 under inspection and the test socket 110 and between the test socket 110 and the tester 30. Further, when the pusher 130 pressurizes the device 10 under inspection, the electrically-conductive part lower bump 123 of the electrically-conductive part 119 protruding from the lower surface of the nonelastic insulating housing 112 may be elastically deformed to provide the stroke required to connect the terminal 11 of the device 10 under inspection to the tester 30.

As above, in the test apparatus 100 according to one embodiment of the present disclosure, the nonelastic insulating housing 112 of the test socket 110 serves as a stopper. Accordingly, difficulty in stroke control occurred in a conventional technique utilizing a rubber socket type test socket due to a thickness tolerance of a stroke limiting part, a thickness tolerance of a stopper part of the test socket, a height tolerance of the test socket, a thickness tolerance of the device under inspection, or the like is reduced, and it is possible to precisely control of the stroke. In addition, life characteristic of the test socket 110 may be improved by a precise control of the stroke.

In addition, since the test socket 110 of the present disclosure utilizes a nonelastic insulator as a dielectric substance interposed between the plurality of electrically-conductive parts 119, it is possible to manufacture the nonelastic insulating housing 112 from a material having an excellent dielectric constant for high-frequency signal transmission. Since a conventional rubber socket type test socket utilizes silicone rubber having a high dielectric constant as an insulating housing, it was not easy to improve high frequency signal transmission characteristics. On the contrary, in the present disclosure, the nonelastic insulating housing 112 is formed of a material having a relatively low dielectric constant so that electromagnetic wavelengths can be propagated well, so high-frequency signal transmission characteristics can be improved. In addition, even if the electrically-conductive parts having the same diameter are applied, using a nonelastic insulator rather than an elastic insulator is advantageous for improving signal transmission characteristics, so the signal transmission characteristic of the present disclosure is superior to that of the prior art.

On the other hand, in the conventional test socket using an elastic insulator and electrically-conductive particles, there are problems in that a phenomenon in which oil is eluted from the elastic insulator is occurred and oil gets in touch with the device to inspection, resulting in a defect in the device under inspection. On the other hand, since the present disclosure utilizes a nonelastic insulator, it is possible to reduce the occurrence of oil, and defects in the device under inspection.

In addition, since the test socket 110 of the present disclosure utilizes the nonelastic insulating housing 112 having nonelastic properties as an insulating housing supporting the plurality of electrically-conductive parts 119, deformation is minimized and durability is excellent as compared with the conventional test socket.

Further, the test socket 110 of the present disclosure enables stable inspection even for the device under inspection having warpage deformation, and has excellent resistance against such the device under inspection. That is, as shown sequentially FIGS. 5A and 5B, when the device 10 under inspection having warpage deformation in a form in which a central portion is curved upward is brought into contact with an upper surface from the above, the lower surface of device 10 under inspection comes into contact with the upper surface of the nonelastic insulating housing 112. Since unlike the conventional elastic insulating part, the nonelastic insulating housing 112 is not compressed and deformed, the device 10 under inspection is flattened, so the terminal 11 of the device 10 under inspection and the electrically-conductive part 119 of the test socket 110 may be in good contact with each other.

Figure 6:
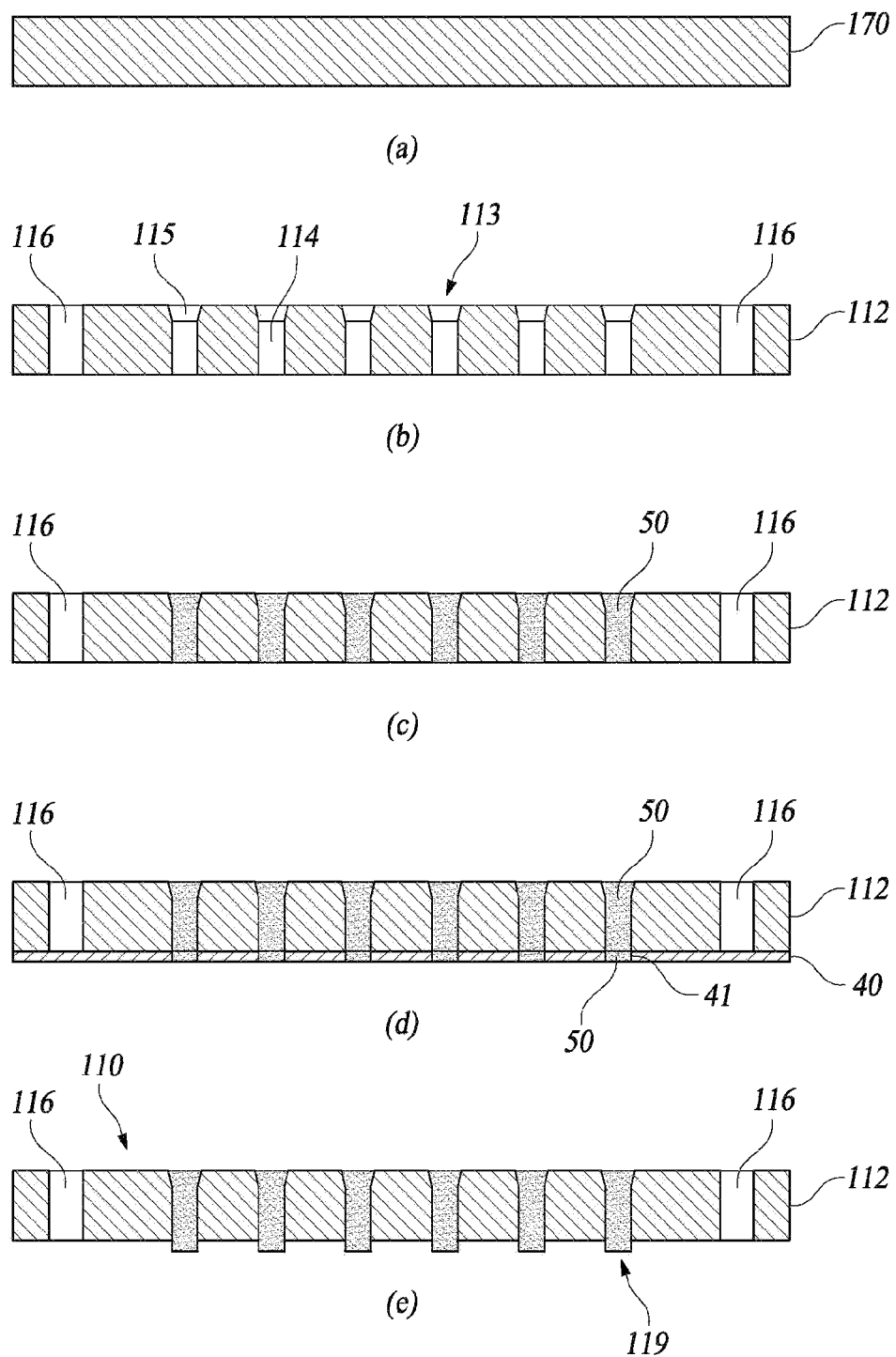
FIG. 6 is a view illustrating a process for manufacturing the test socket provided in the test apparatus according to one embodiment of the present disclosure.

The test socket 110 of the test apparatus 100 according to one embodiment of the present disclosure may be manufactured using the same method as that shown in FIG. 6.

First, as illustrated in FIG. 6A, a nonelastic member 170 formed of the nonelastic insulating material is prepared. As described above, the nonelastic member 170 may be formed of polyimide or other material.

Next, as shown in FIG. 6B, the plurality of housing holes 113 and the alignment hole 116 passing thorough the nonelastic member 170 in the thickness direction are formed in the nonelastic member 170 to manufacture the nonelastic insulating housing 112.

Next, as shown in of FIG. 6C, the plurality of housing holes 113 are filled with an electrically-conductive particle mixture 50 in which electrically-conductive particles are contained in an elastic insulating material. The electrically-conductive particle mixture 50 may be pressed into the housing holes 113 in the form of a paste having fluidity.

Then, as shown in FIG. 6D, a mold 40 having a plurality of mold holes 41 corresponding to the housing holes 113 of the nonelastic insulating housing 112 is prepared, and the plurality of mold holes 41 are then filled with the electrically-conductive particle mixture 50. The electrically-conductive particle mixture 50 may be pressed into the mold holes 41 in the form of a paste having fluidity. Then, the mold 40 in which the electrically-conductive particle mixture 50 is disposed is disposed below the nonelastic insulating housing 112. At this time, the mold 40 is disposed such that the plurality of mold holes 41 correspond to the plurality of housing holes 113 in a one-to-one relation.

Then, a curing process is performed in a state in which the electrically-conductive particle mixture 50 disposed in the nonelastic insulating housing 112 is in contact with the electrically-conductive particle mixture 50 disposed in the mold 40. As a method for curing the electrically-conductive particle mixture 50, various methods such as a method in which the particle mixture is heated to a certain temperature and then cooled to a room temperature, may be employed depending on the characteristics of the electrically-conductive particle mixture 50.

As the electrically-conductive particle mixture 50 is cured through a curing process, the electrically-conductive part 119, which includes the electrically-conductive part body 120 disposed in the housing hole 113 and the electrically-conductive part lower bump 123 disposed in the mold hole 41, is formed. After the electrically-conductive part 119 is formed, as illustrated in FIG. 6E, the test socket 110 may be completed by removing the nonelastic insulating housing 112 and the mold 40.

In the method for manufacturing the test socket 110 as descried above, a process of applying a magnetic field to the electrically-conductive particle mixture 50 may be performed before curing the electrically-conductive particle mixture 50. If the magnetic field is applied on the electrically-conductive particle mixture 50, the electrically-conductive particles dispersed in the elastic insulating material may oriented in the thickness direction of the nonelastic insulating housing 112 under the influence of the magnetic field to form an electrical path.

In addition, in the method for manufacturing the test socket 110, the electrically-conductive part body 120 and the electrically-conductive part lower bump 123 of the electrically-conductive part 119 may be formed simultaneously in one forming mold.

In addition, in the method for manufacturing the test socket 110, after the mold 40 in which the electrically-conductive particle mixture 50 is received is coupled to a lower side of the nonelastic insulating housing 112, the plurality of housing holes 113 may be filled with electrically-conductive particle mixture 50 and the above mixture may be then cured.

Figure 7:
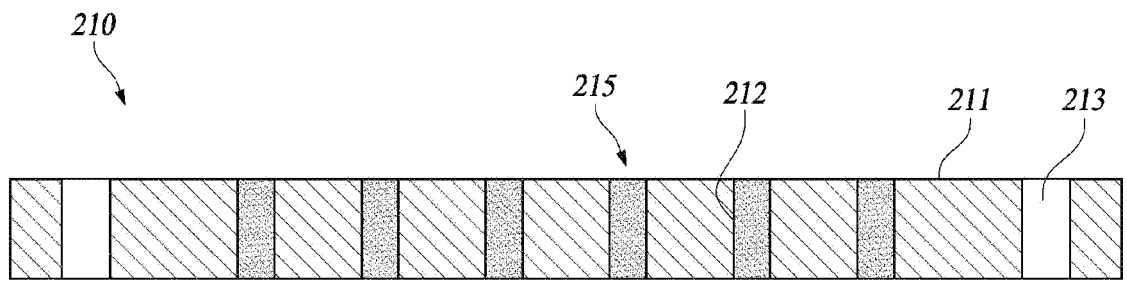
FIGS. 7 to 11 illustrate various modified examples of the test socket.

On the other hand, a test socket 210 shown in FIG. 7 includes a nonelastic insulating housing 211 having a plurality of housing holes 212 and alignment holes 213, and a plurality of electrically-conductive parts 215 disposed in the plurality of housing holes 212, respectively, to pass through the nonelastic insulating housing 211 in the thickness direction.

Such the test socket 210 has a configuration in which the electrically-conductive part 215 does not have an electrically-conductive part bump.

Figure 8:
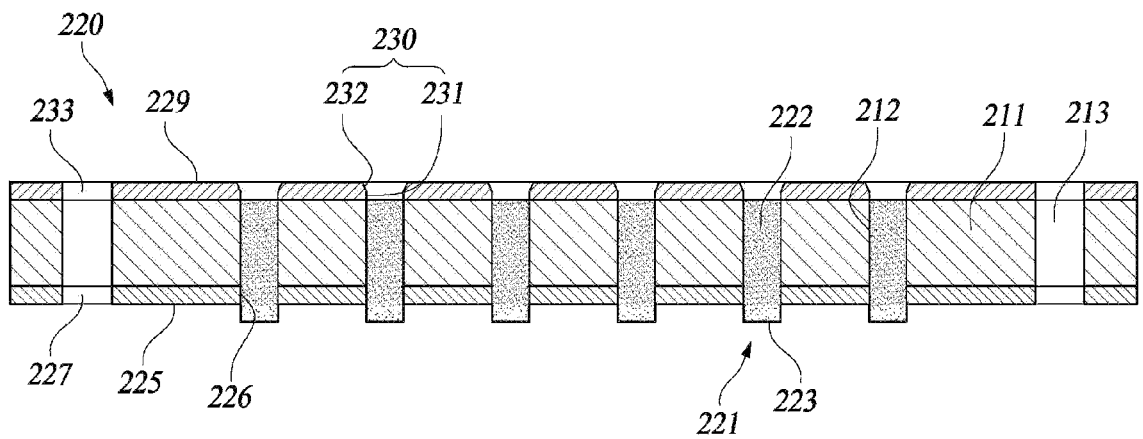

A test socket 220 shown in FIG. 8 includes the nonelastic insulating housing 211 having the plurality of housing holes 212, the plurality of electrically-conductive parts 221 disposed in the plurality of housing holes 212, respectively, a lower insulating sheet 225 disposed on a lower surface of the nonelastic insulating housing 211, and an upper insulating sheet 229 disposed on an upper surface of the nonelastic insulating housing 211. The nonelastic insulating housing 211 is the same as that shown in FIG. 7.

The electrically-conductive part 221 may be formed to have a configuration in which a plurality of electrically-conductive particles are contained in an elastic insulating material. The electrically-conductive part 221 includes an electrically-conductive part body 222 placed in the housing hole 212 and an electrically-conductive part lower bump 223 which is connected to the electrically-conductive part body 222 to protrude from the lower surface of the nonelastic insulating housing 211.

The lower insulating sheet 225 is formed of an insulating material and covers the lower surface of the nonelastic insulating housing 112. The lower insulating sheet 225 functions to prevent a short-circuit defect in which the lower surface of the nonelastic insulating housing 211 comes into contact with a signal electrode 31 of the tester 30. In the lower insulating sheet 225, a plurality of lower insulating sheet holes 226 into which the electrically-conductive parts 221 are inserted, respectively, are formed. In addition, the lower insulating sheet 225 is provided with a lower insulating sheet guide hole 227 passing through the lower insulating sheet 225 in the thickness direction. The lower insulating sheet guide hole 227 is in communication with the alignment hole 213, and the alignment pin 162 of the guide housing 160 may be inserted into the lower insulating sheet guide hole 227.

The upper insulating sheet 229 is formed of an insulating material, and includes a plurality of upper insulating sheet holes 230 formed at positions corresponding to the plurality of electrically-conductive parts 320. The upper insulating sheet hole is formed to have a tapered shape such that a width of at least a portion thereof is gradually decreased from an upper surface of the upper insulating sheet 229 towards the nonelastic insulating housing 211. That is, the upper insulating sheet hole 230 includes an insulating sheet lower hole 231 extending from a lower surface of the upper insulating sheet 229 to an upper surface of the upper insulating sheet 229 and having a width which is the same as that of the housing hole 212, and an insulating sheet upper hole 232 extending from the upper surface of the upper insulating sheet 229 to the lower surface of the upper insulating sheet 229 to be in communication with the insulating sheet lower hole 231. The insulating sheet upper hole 232 is formed to have a tapered shape such that a width thereof is gradually decreased from the upper surface of the upper insulating sheet 229 towards the insulating sheet lower hole 231.

In addition, the upper insulating sheet 229 is provided with an upper insulating sheet guide hole 233 passing through the upper insulating sheet 229 in the thickness direction. The upper insulating sheet guide hole 233 is in communication with the alignment hole 213, and the alignment pin 162 of the guide housing 160 may be inserted into the upper insulating sheet guide hole 233.

In this test socket 220, since the upper insulating sheet hole 230 is formed to have a tapered shape, when the device 10 under inspection approaches the test socket 220, the terminal 11 of the device 10 under inspection is guided by the upper insulating sheet 229, so this terminal may be more stably brought into contact with the electrically-conductive part 221.

Figure 9:
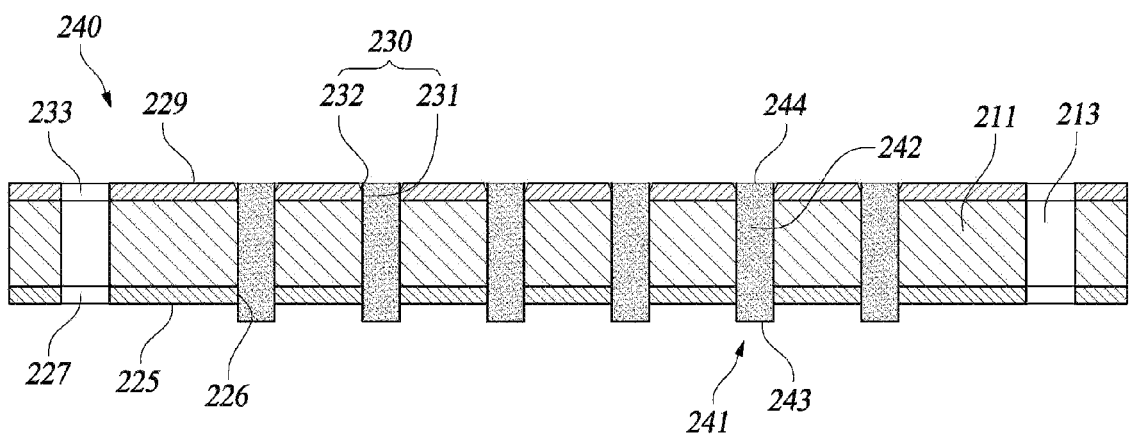

A test socket 240 shown in FIG. 9 includes the nonelastic insulating housing 211 having the plurality of housing holes 212, a plurality of electrically-conductive parts 241 disposed in the plurality of housing holes 212, respectively, the lower insulating sheet 225 disposed on the lower surface of the nonelastic insulating housing 211, and the upper insulating sheet 229 disposed on the upper surface of the nonelastic insulating housing 211. The nonelastic insulating housing 211, the lower insulating sheet 225, and the upper insulating sheet 229 are the same as those shown in FIG. 8.

The electrically-conductive part 241 may be formed to have a configuration in which a plurality of electrically-conductive particles are contained in an elastic insulating material. The electrically-conductive part 241 includes an electrically-conductive part body 242 placed in the housing hole 212, an electrically-conductive part lower bump 243 connected to the electrically-conductive part body 242 to protrude from the lower surface of the nonelastic insulating housing 211, and an electrically-conductive part upper bump 244 connected to the electrically-conductive part body 242 and protruding from the upper surface of the nonelastic insulating housing 211. The electrically-conductive part upper bump 244 is placed in the upper insulating sheet hole 230 of the upper insulating sheet 229. A width of the electrically-conductive part upper bump 244 is the same as a width of the electrically-conductive part body 242, and a space is provided between the electrically-conductive part upper bump 244 and the upper insulating sheet 229.

Figure 10:
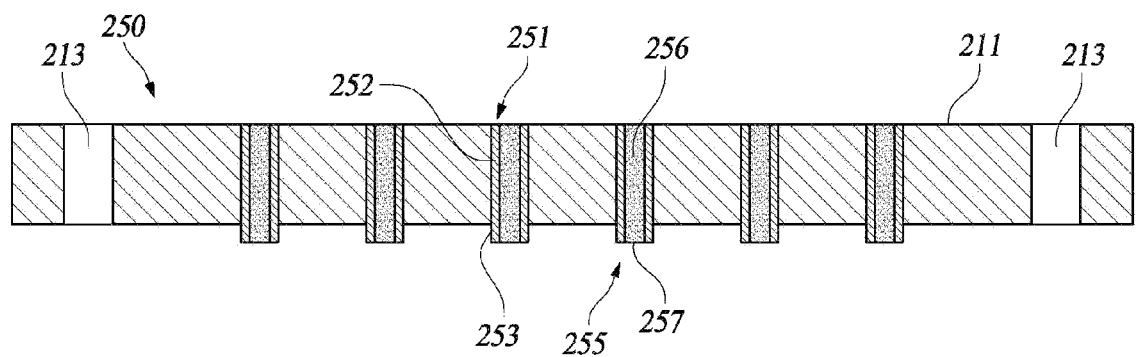

A test socket 250 shown in FIG. 10 includes the nonelastic insulating housing 211 having the plurality of housing holes 212, a plurality of insulating parts 251 disposed in the plurality of housing holes 212, respectively, and a plurality of electrically-conductive parts 255 supported by the insulating parts 251 so as to pass through the nonelastic insulating housing 211 in the thickness direction.

The insulating part 251 includes an insulating part body 252 placed in the housing hole 212, and an insulating part lower bump 253 extending downward from the insulating part body 252 so as to protrude from the lower surface of the nonelastic insulating housing 211.

The electrically-conductive part 255 may be formed to have a configuration in which a plurality of electrically-conductive particles are contained in an elastic insulating material. The electrically-conductive part 255 may be supported by the insulating part 251 and disposed in the housing hole 212 to pass through the nonelastic insulating housing 211 in the thickness direction.

The electrically-conductive part 255 includes an electrically-conductive part body 256 placed in the housing hole 212, and an electrically-conductive part lower bump 257 which is connected to the electrically-conductive part body 256 to protrude from the lower surface of the nonelastic insulating housing 211. The electrically-conductive part body 256 is surrounded by the insulating part body 252, and the electrically-conductive part lower bump 257 is surrounded by the insulating part lower bump 253.

The electrically-conductive part 255 may be formed inside the insulating part 251 in various ways. For example, the electrically-conductive part 255 may be formed by a method including forming the insulating part hole in the insulating part 251, filling the insulating part hole with an electrically-conductive particle mixture in which electrically-conductive particles are contained in an elastic insulating material, and curing the electrically-conductive particle mixture. As another example, the electrically-conductive part 255 may be formed by filling the plurality of housing holes 212 with the electrically-conductive particle mixture, disposing a magnet smaller than a width of the housing hole 212 at a position corresponding to each housing hole 212, and applying a magnetic field to the electrically-conductive particle mixture, That is, the electrically-conductive particles in the electrically-conductive particle mixture are gathered at a center of the housing hole 212 by the magnetic field of the magnet and are aligned in the thickness direction of the nonelastic insulating housing 211, so the electrically-conductive part 255 may be formed. In addition, only the elastic insulating material is remained around the electrically-conductive part 255, and this elastic insulating material is cured to form the insulating part 251.

Figure 11:
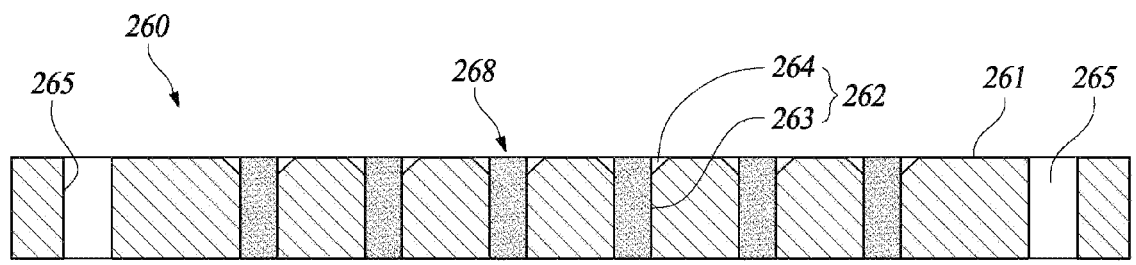

A test socket 260 shown in FIG. 11 includes a nonelastic insulating housing 261 having a plurality of housing holes 262 and an alignment hole 265, and a plurality of electrically-conductive part 268 disposed in the plurality of housing holes 262, respectively, and passing through the nonelastic insulating housing 261 in the thickness direction.

The nonelastic insulating housing 261 is formed of a nonelastic insulating material which is the same as that described above. The plurality of housing holes 262 are formed to pass through the nonelastic insulating housing 261 in the thickness direction. The housing hole 262 includes a housing lower hole 263 extending upward from a lower surface of the nonelastic insulating housing 261 and having a constant width, and a housing upper hole 264 extending downward from an upper surface of the nonelastic insulating housing 261 to be in communication with the housing lower hole 263. The housing upper hole 264 is formed to have a tapered shape in which a width thereof is gradually decreased from the upper surface the nonelastic insulating housing 261 towards a lower side.

The electrically-conductive part 268 may be formed to have a configuration in which a plurality of electrically-conductive particles are contained in an elastic insulating material. A width of the electrically-conductive part 268 is the same as that of the housing lower hole 263, and an upper end portion of the electrically-conductive part 268 is placed in the housing upper hole 264. Accordingly, a space is provided between the upper end portion of the electrically-conductive part 268 and the nonelastic insulating housing 261.

In this test socket 260, since the upper portion of the electrically-conductive part 268 is disposed in the tapered housing upper hole 264, when the device 10 under inspection approaches the test socket 260, the terminal 11 of the device 10 under inspection may be more stably brought into contact with the electrically-conductive part upper bump 269. In addition, when the device 10 under inspection approaches the test socket 260, the terminal 11 of the device 10 under inspection may come into contact with the nonelastic insulating housing 261, so it is possible to reduce the problem in that the terminal 11 is damaged.

Although the present disclosure has been described with a preferred example, a scope of the present disclosure is not limited to the form described and illustrated above.

For example, the pressure transmission configuration configured to transmit the pressurizing force of the pusher 130 to the device 10 under inspection is not limited to that illustrated in the drawings, and may be variously modified.

In addition, although the drawings show that the test socket is assembled with the guide housing 160 capable of guiding the device 10 under inspection, and fixed to the tester 30, the test socket may be assembled with components having various other structures that are coupled to the tester.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims. The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A test socket provided in a test apparatus in which a device under inspection having a terminal is connected to a tester, which generates a test signal, for testing the device under inspection, the test socket comprising:
    a nonelastic insulating housing formed of a nonelastic insulating material and provided with a plurality of housing holes formed therein to pass therethrough in a thickness direction; and
    an electrically-conductive part formed to have a configuration in which a plurality of electrically-conductive particles are contained in an elastic insulating material, the electrically-conductive part having a lower end portion connected to a signal electrode of the tester placed below the nonelastic insulating housing and an upper end portion disposed in the housing hole to be connected to the terminal of the device under inspection placed on the nonelastic insulating housing, whereby the electrically-conductive part passes through the nonelastic insulating housing in the thickness direction,
    wherein an alignment hole is formed in the nonelastic insulating housing to pass through the nonelastic insulating housing in the thickness direction, whereby an alignment pin of an element used for fixing the nonelastic insulating housing to the tester can pass through the alignment hole.

2. The test socket of claim 1, wherein the nonelastic insulating housing has hardness in the range of 3B to 6H.

3. The test socket of claim 2, wherein the nonelastic insulating housing is formed of polyimide.

4. The test socket of claim 1, wherein the electrically-conductive part comprises:
    an electrically-conductive part body placed in the housing hole; and
    an electrically-conductive part lower bump connected to the electrically-conductive part body to protrude from a lower surface of the nonelastic insulating housing,
    wherein the electrically-conductive part satisfies the following condition:

$$0.05 \leq \frac{Lb}{Lt} \leq 0.5$$

here, Lt is the sum of a length of the electrically-conductive part body and a length of the electrically-conductive part lower bump, and Lb represents a length of the electrically-conductive part lower bump.

5. The test socket of claim 1, wherein the housing hole comprises;
    a housing lower hole extending upward from a lower surface of the nonelastic insulating housing and having a constant width; and
    a housing upper hole formed to have a tapered shape in which a width thereof is gradually decreased from an upper surface the nonelastic insulating housing towards a lower side, and being in in communication with the housing lower hole.

6. The test socket of claim 1, further comprising:
    an insulating part formed of an elastic insulating material and disposed between the nonelastic insulating housing and the electrically-conductive part.

7. The test socket of claim 1, further comprising:
    an upper insulating sheet formed of an insulating material, providing with upper insulating sheet holes formed at positions corresponding to the electrically-conductive parts, and coupled to the upper surface of the nonelastic insulating housing,
    wherein the upper insulating sheet hole is formed to have a tapered shape such that a width of at least a portion thereof is gradually decreased from an upper surface of the upper insulating sheet towards the nonelastic insulating housing.

8. The test socket of claim 7, wherein the electrically-conductive part comprises:
    an electrically-conductive part body placed in the housing hole; and
    an electrically-conductive part upper bump connected to the electrically-conductive part body and protruding from the upper surface of the nonelastic insulating housing, wherein a width of the uppermost portion of the upper insulating sheet hole is larger than that of the electrically-conductive part upper bump.

9. A test apparatus configured to connect a device under inspection having a terminal to a tester generating a test signal, for testing the device under inspection, comprising:
a test socket configured to electrically connect the tester and the device under inspection for enabling a test signal of the tester to be transmitted to the device under test;
a guide housing coupled to the tester to fix the test socket to the tester, and having an alignment pin inserted into a fixing hole of the tester; and
a pusher being movable to approach the tester or moved away from the tester, thereby providing a pressurizing force capable of pressurizing the device under inspection placed on the test socket towards the tester,
wherein the test socket comprises:
a nonelastic insulating housing formed of a nonelastic insulating material, and provided with a plurality of housing holes formed therein to pass therethrough in a thickness direction and an alignment hole formed to pass therethrough in a thickness direction for enabling the alignment pin to pass the alignment hole; and
an electrically-conductive part formed to have a configuration in which a plurality of electrically-conductive particles are contained in an elastic insulating material, the electrically-conductive part having a lower end portion connected to a signal electrode of the tester placed below the nonelastic insulating housing and an upper end portion disposed in the housing hole to be connected to the terminal of the device under inspection placed on the nonelastic insulating housing, whereby the electrically-conductive part passes through the nonelastic insulating housing in the thickness direction.

10. The test apparatus of claim 9, further comprising:
a buffering part disposed between the pusher and the device under inspection so as to buffer a pressure applied to the device under inspection by the pusher.

11. A method for manufacturing a test socket provided in a test apparatus in which a device under inspection having a terminal is connected to a tester, which generates a test signal, to test the device under inspection, the method comprising the steps of:

(a) preparing a nonelastic member formed of a nonelastic insulating material;
(b) forming a plurality of housing holes and an alignment hole in the nonelastic insulating material to form a nonelastic insulating housing, the plurality of housing holes passing through the nonelastic insulating material in a thickness direction and the alignment hole passing through the nonelastic insulating material in the thickness direction to enable an alignment pin of an element, which is used for fixing the test socket to the tester, to pass through nonelastic insulating material; and
(c) forming an electrically-conductive part in the housing hole, the electrically-conductive part comprising an elastic insulating material in which a plurality of electrically-conductive particles are included.

12. The method for manufacturing a test socket of claim 11, wherein, in the step (c), the electrically-conductive part is formed to satisfy the following condition:

$$0.05 \leq \frac{Lb}{Lt} \leq 0.5$$

here, Lt is the sum of a length of the electrically-conductive part body placed in the housing hole and a length of the electrically-conductive part lower bump connected to the electrically-conductive part body to protrude from a lower surface of the nonelastic insulating housing, and Lb represents a length of the electrically-conductive part lower bump.

13. The method for manufacturing a test socket of claim 12, wherein, the step (c) comprises the steps of;
filling the plurality of housing holes with an electrically-conductive particle mixture in which electrically-conductive particles are contained in an elastic insulating material;
preparing a mold having a plurality of mold holes corresponding to the plurality of housing holes and filling the plurality of mold holes with the electrically-conductive particle mixture;
coupling the mold to a lower surface of the nonelastic insulating housing so as to correspond the plurality of mold holes to the plurality of housing holes in a one-to-one relation; and
integrally curing electrically-conductive particle mixtures contained in the housing hole and the mold hole.

* * * * *